United States Patent
Ku et al.

(10) Patent No.: US 11,908,885 B2
(45) Date of Patent: Feb. 20, 2024

(54) SEMICONDUCTOR DEVICE STRUCTURE WITH MAGNETIC ELEMENT

(71) Applicant: Taiwan Semiconductor Manufacturing Company, Ltd., Hsinchu (TW)

(72) Inventors: Chin-Yu Ku, Hsinchu (TW); Chi-Cheng Chen, Tainan (TW); Hon-Lin Huang, Hsinchu (TW); Wei-Li Huang, Pingtung County (TW); Chun-Yi Wu, Tainan (TW); Chen-Shien Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/739,487

(22) Filed: May 9, 2022

(65) Prior Publication Data
US 2022/0262892 A1 Aug. 18, 2022

Related U.S. Application Data

(63) Continuation of application No. 16/907,699, filed on Jun. 22, 2020, now Pat. No. 11,329,124, which is a continuation of application No. 16/260,439, filed on Jan. 29, 2019, now Pat. No. 10,720,487.

(60) Provisional application No. 62/691,108, filed on Jun. 28, 2018.

(51) Int. Cl.
*H01L 49/02* (2006.01)

(52) U.S. Cl.
CPC ................................. *H01L 28/10* (2013.01)

(58) Field of Classification Search
CPC ..................................................... H01L 28/10
See application file for complete search history.

(56) References Cited

U.S. PATENT DOCUMENTS

| | | | |
|---|---|---|---|
| 7,323,948 B2 | 1/2008 | Ding et al. | |
| 7,829,425 B1 | 11/2010 | Hopper et al. | |
| 8,772,051 B1 | 7/2014 | Zhong et al. | |
| 10,164,001 B1 | 12/2018 | Lee et al. | |
| 10,720,487 B2 | 7/2020 | Ku et al. | |
| 2004/0211749 A1 | 10/2004 | Grynkewich et al. | |
| 2005/0051820 A1 | 3/2005 | Stojakovic et al. | |
| 2009/0068347 A1* | 3/2009 | Lotfi | H01F 1/15333 427/132 |
| 2009/0236734 A1 | 9/2009 | Lee et al. | |
| 2010/0117169 A1* | 5/2010 | Anderson | H10N 50/10 257/E29.323 |
| 2012/0068301 A1 | 3/2012 | Sin et al. | |
| 2012/0267753 A1 | 10/2012 | Yeh et al. | |
| 2014/0035630 A1 | 2/2014 | O'Donnell et al. | |
| 2015/0104882 A1 | 4/2015 | Jung et al. | |
| 2015/0311901 A1* | 10/2015 | Bromberg | G11C 11/1675 326/38 |

(Continued)

*Primary Examiner* — Thao P Le
(74) *Attorney, Agent, or Firm* — Birch, Stewart, Kolasch & Birch, LLP

(57) ABSTRACT

A semiconductor device structure is provided. The semiconductor device structure includes a substrate and a magnetic element over the substrate. The semiconductor device structure also includes an isolation element over the magnetic element. The i magnetic element is wider than the isolation element. The semiconductor device structure further includes a conductive line over the isolation element.

20 Claims, 9 Drawing Sheets

(56) References Cited

U.S. PATENT DOCUMENTS

| | | |
|---|---|---|
| 2016/0308112 A1 | 10/2016 | Tan et al. |
| 2016/0322269 A1 | 11/2016 | Pagani et al. |
| 2017/0222130 A1 | 8/2017 | Annunziata et al. |
| 2017/0263675 A1* | 9/2017 | Park ....................... H10N 50/01 |
| 2019/0164584 A1 | 5/2019 | Chuang et al. |
| 2020/0066831 A1 | 2/2020 | Hsu et al. |
| 2020/0075075 A1 | 3/2020 | Chen et al. |
| 2020/0075708 A1* | 3/2020 | Chen ....................... H01L 28/10 |
| 2021/0376053 A1* | 12/2021 | Hsu ....................... H01F 41/046 |
| 2022/0173035 A1* | 6/2022 | Lekas ................ H01F 17/0033 |

\* cited by examiner

SEMICONDUCTOR DEVICE STRUCTURE WITH MAGNETIC ELEMENT

PRIORITY CLAIM AND CROSS-REFERENCE

This application is a Continuation application of U.S. patent application Ser. No. 16/907,699, filed on Jun. 22, 2020, which is a Continuation application of U.S. patent application Ser. No. 16/260,439, filed on Jan. 29, 2019, which claims the benefit of U.S. Provisional Application No. 62/691,108, filed on Jun. 28, 2018, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
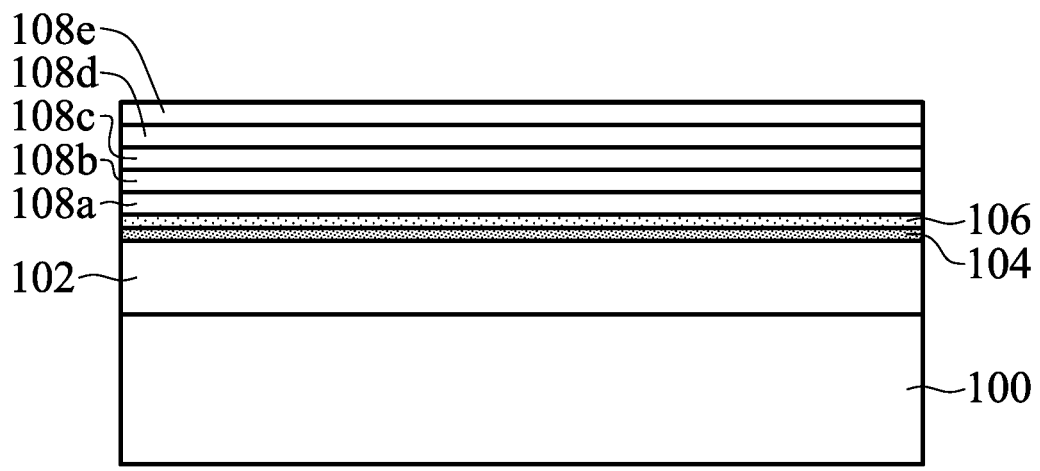
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a semiconductor substrate 100 is received or provided. The semiconductor substrate 100 may include a semiconductor wafer with multiple device elements formed therein. For example, the semiconductor substrate 100 is a silicon wafer with transistors formed therein.

In some embodiments, an interconnection structure 102 is formed over the semiconductor substrate 100. The interconnection structure 102 may include multiple dielectric layers and multiple conductive features. These conductive features form electrical connections between the device elements and other elements to be formed later. In some embodiments, the topmost dielectric layer of the interconnection structure 102 is made of or includes a polymer material. For example, the polymer material is polyimide or another suitable material.

As shown in FIG. 1A, a protective layer 104 is deposited over the interconnection structure 102, in accordance with some embodiments. The protective layer 104 may be used to protect the interconnection structure 102 during a subsequent etching process for improving the quality of magnetic elements. In some embodiments, the protective layer 104 is a single layer. In some other embodiments, the protective layer 104 includes multiple sub-layers. The sub-layers may be made of the same material. Alternatively, some of the sub-layers are made of different materials.

The protective layer 104 may be made of or include silicon nitride, silicon oxide, silicon oxynitride, silicon carbide, one or more other suitable materials, or a combination thereof. The protective layer 104 may be deposited using a chemical vapor deposition (CVD) process, an atomic layer deposition (ALD) process, a physical vapor deposition (PVD) process, a spin-on process, one or more other applicable processes, or a combination thereof.

The protective layer 104 may have a thickness that is in a range from 0.1 μm to about 3 μm. In some cases, if the protective layer 104 is thinner than about 0.1 μm, the protective layer 104 may be too thin and not be able to protect the interconnection structure 102 thereunder. In some other cases, if the protective layer 104 is thicker than about 3 μm, the stress of the protective layer 104 may be too high. The protective layer 104 may be broken or delaminated due to the high stress, which may negatively affect the quality and reliability of the semiconductor device structure.

As shown in FIG. 1A, an etch stop layer 106 is deposited over the protective layer 104, in accordance with some embodiments. The etch stop layer 106 may protect the protective layer 104 and the interconnection structure 102 thereunder from being damaged during a subsequent etching process for forming magnetic elements. In some embodiments, the etch stop layer 106 is a single layer. In some other embodiments, etch stop layer 106 includes multiple sub-layers. The sub-layers may be made of the same material. Alternatively, some of the sub-layers are made of different materials.

In some embodiments, the etch stop layer 106 and the protective layer 104 are made of different materials. The etch stop layer 106 may be made of or include tantalum oxide, zirconium oxide, tantalum nitride, one or more other suitable materials, or a combination thereof. In some other embodiments, a metal layer is deposited over the interconnection structure 102. Afterwards, an oxidation process and/or a nitridation process are used to transform the metal layer into the protective layer 104.

As shown in FIG. 1A, two or more magnetic layers (such as magnetic layers 108a-108e) are sequentially deposited over the etch stop layer 106, in accordance with some embodiments. These magnetic layers 108a-108e will be patterned later to form one or more magnetic elements. In some embodiments, the magnetic layers 108a-108e are made of the same material. In some other embodiments, some of the magnetic layers 108a-108e are made of different materials. In some embodiments, each of the magnetic layers 108a-108e has the same thickness. In some other embodiments, some of the magnetic layers 108a-108e have different thicknesses.

In some embodiments, the magnetic layers 108a-108e contain cobalt, zirconium, tantalum, iron, nickel, one or more other elements, or a combination thereof. The magnetic layers 108a-108e may be made of or include an alloy containing cobalt, zirconium, and tantalum (CZT), an alloy containing cobalt and zirconium, an alloy containing iron and nickel, one or more other suitable materials, or a combination thereof. The magnetic layers 108a-108e may be deposited using a PVD process, a CVD process, an ALD process, one or more other applicable processes, or a combination thereof.

Figure 1B:
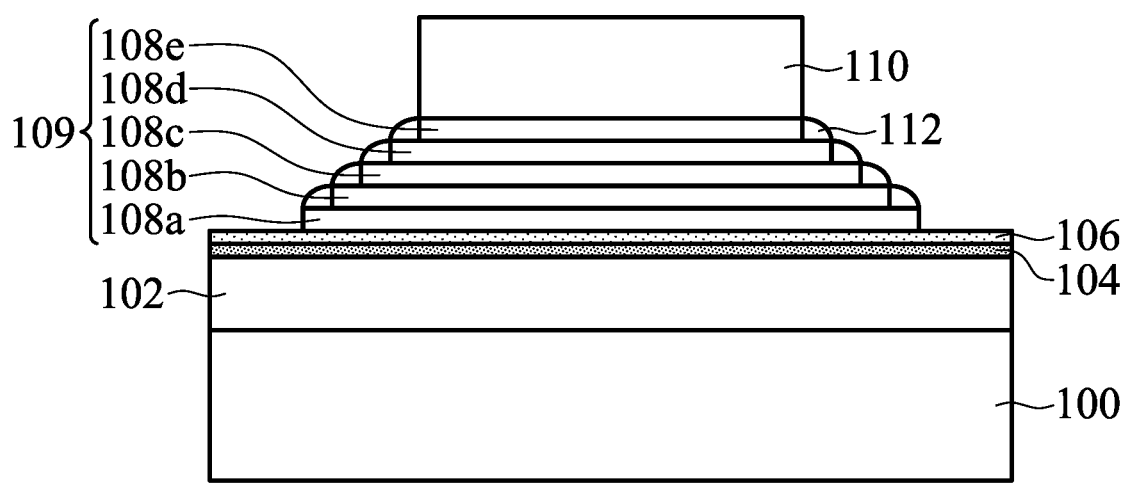

As shown in FIG. 1B, a patterned mask layer 110 is formed over the magnetic layer 108e, in accordance with some embodiments. The patterned mask layer 110 is used to assist in a subsequent patterning process of the magnetic layers 108a-108e. In some embodiments, the patterned mask layer 110 is a patterned photoresist layer. A photolithography process may be used to form the patterned mask layer 110 with the desired pattern. For example, the top view of the patterned mask layer 110 may have a square shape, a rectangular shape, or another suitable shape.

Afterwards, the magnetic layers 108a-108e are partially removed, as shown in FIG. 1B in accordance with some embodiments. As a result, the remaining portions of the magnetic layers 108a-108e together form a magnetic element 109. In some embodiments, with the patterned mask layer 110 as an etching mask, an etching process is used to partially remove the magnetic layers 108a-108e. In some embodiments, the etching process is a wet etching process. The etchant used in the wet etching process may include nitric acid, hydrochloric acid, hydrofluoric acid, one or more other suitable etchants, or a combination thereof. For example, a mixture of nitric acid, hydrochloric acid, and hydrofluoric acid is used in the wet etching process. The etch stop layer 106 and the protective layer 104 may protect the interconnection structure 102 from being damaged during the wet etching process for patterning the magnetic layers 108a-108e.

In some cases, due to the characteristics of the magnetic layers 108a-108e and the wet etching process, hollow structures 112 may be formed at sidewalls surfaces of the magnetic element 109, as shown in FIG. 1B. The hollow structures 112 include voids inside, which may negatively affect the quality and reliability of the formed magnetic element 109.

Figure 1C:
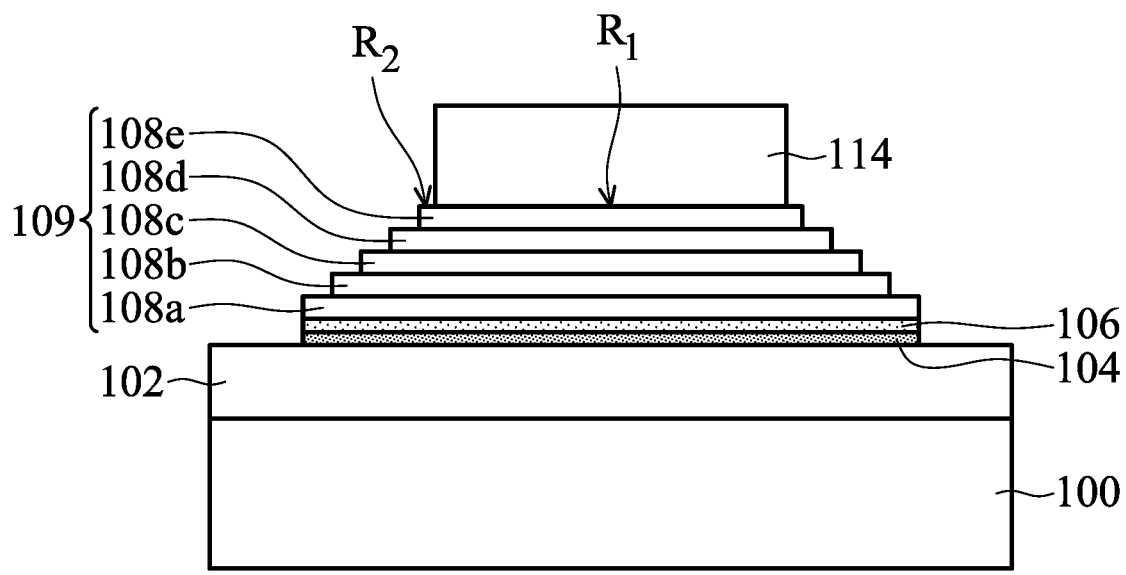

As shown in FIG. 1C, a mask element 114 is formed to partially cover the top surface of the magnetic element 109, in accordance with some embodiments. The material and formation method of the mask element 114 may be the same as or similar to those of the patterned mask layer 110. In some embodiments, the magnetic element 109 includes a stack of multiple magnetic layers 108a-108e. In some embodiments, the topmost magnetic layer (i.e., the magnetic layer 108e) is wider than the mask element 114. In some embodiments, the mask element 114 covers a center region $R_1$ of the topmost magnetic layer 108e. The topmost magnetic layer 108e has a periphery region $R_2$ that is not covered by the mask element 114 and surrounds the center region $R_1$ of the topmost magnetic layer 108e.

Afterwards, an etching process is performed to partially remove the magnetic element 109, as shown in FIG. 1C in accordance with some embodiments. In some embodiments, the etching process is a dry etching process that is capable of removing the hollow structures 112 (including voids) at the sidewall surfaces of the magnetic element 109. The etchant used in the dry etching process may include $CF_4$ or another suitable etchant. In some embodiments, due to the protection of the protective layer 104, the dry etching process is performed for a longer period of time to ensure a complete removal of the hollow structures 112. Since the hollow structures 112 are removed, the quality and reliability of the magnetic element 109 are improved.

The etching process may also remove residues and/or particles formed during the formation of the magnetic element 109. In some embodiments, alignment marks are formed in the predetermined dicing region to assist in subsequent patterning processes. For example, a top view of the alignment marks has a triangular profile or a double triangular profile. Due to the etching process, the alignment marks formed on the predetermined dicing regions are prevented from being covered by the residues and/or particles. The subsequent alignment processes are greatly improved. In some other cases where the etching process is not properly performed, residues and/or particles may be formed on the alignment marks to negatively affect the subsequent patterning processes. In some embodiments, after a subsequent dicing process, the alignment marks are removed by the dicing tool.

In some embodiments, the etching process used for removing the hollow structures 112 also partially remove the etch stop layer 106 and the protective layer 104. Alternatively, another etching process is used to remove the protective layer 104 or the etch stop layer 106. As a result, a portion of the interconnection structure 102 is exposed, as shown in FIG. 1C in accordance with some embodiments. One or more conductive pads formed in the interconnection structure 102 may be exposed. Other conductive features such as redistribution layers may be formed later to connect the exposed conductive pads.

Figure 1D:
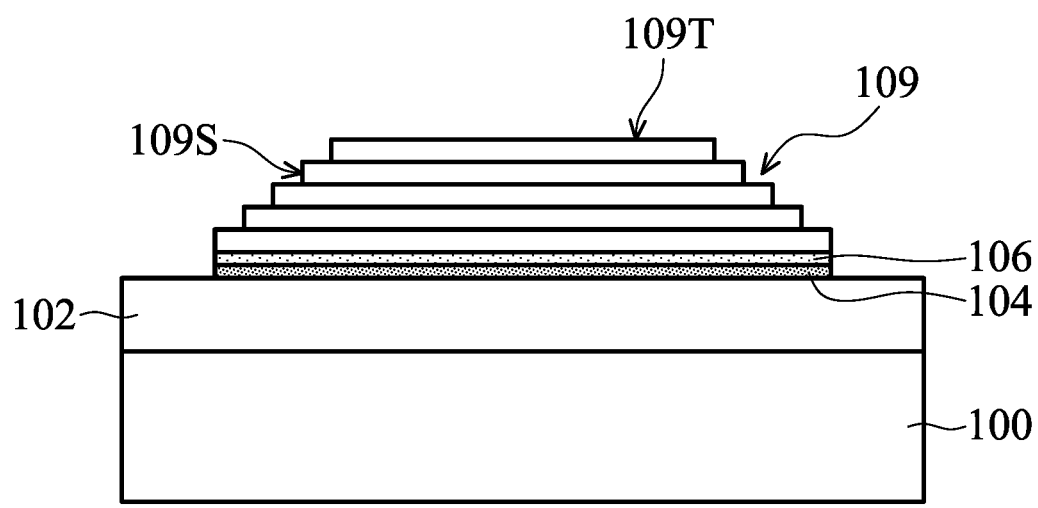

Afterwards, the mask element 114 is removed to expose the top surface 109T of the magnetic element 109, as shown in FIG. 1D in accordance with some embodiments. As shown in FIG. 1D, sidewall surfaces 109S of the magnetic element 109 have stair-like profiles.

Figure 3A:
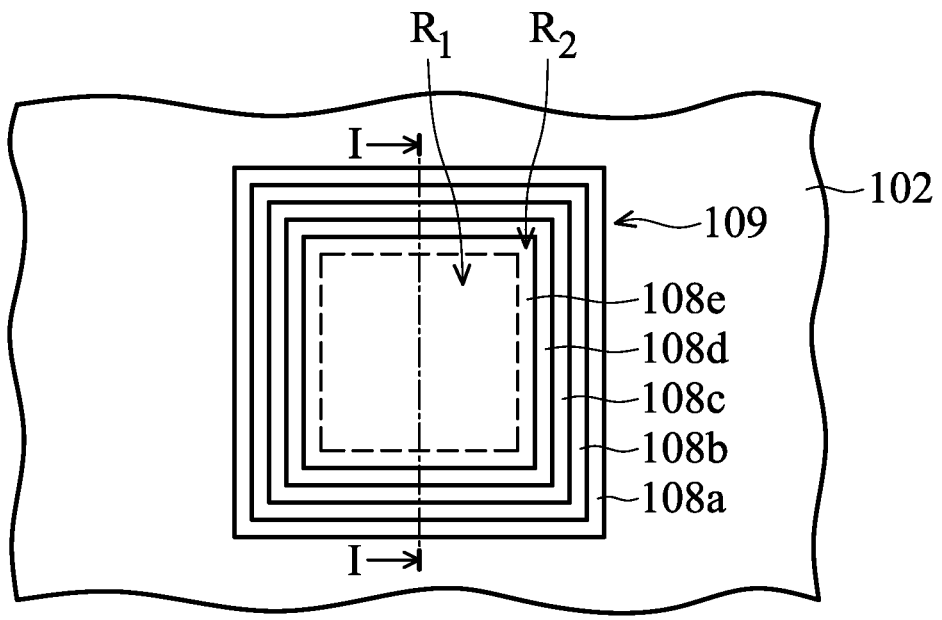
FIGS. 3A-3C are top layout views of various stages of a process for forming a semiconductor device structure, in accordance with some embodiments.
Figure 3B:
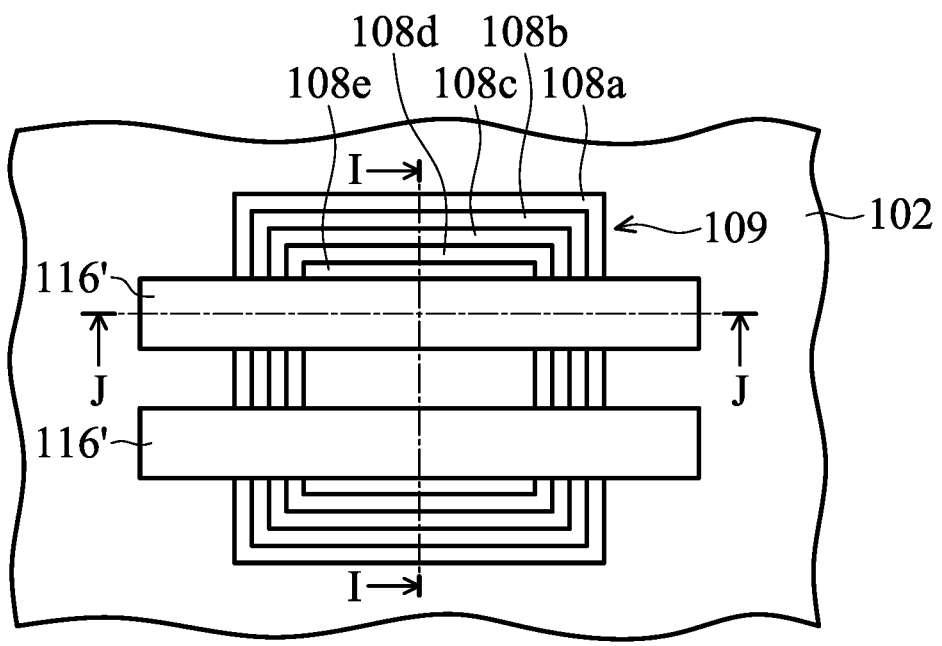
Figure 3C:
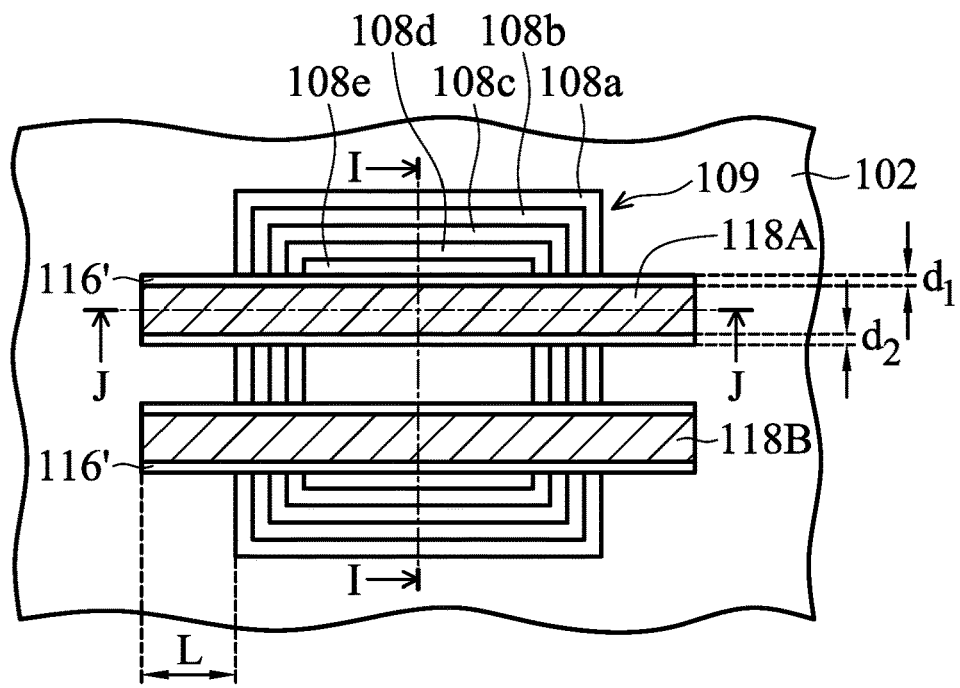

FIGS. 3A-3C are top layout views of various stages of a process for forming a semiconductor device structure, in accordance with some embodiments. In some embodiments, FIG. 3A is a top view layout view of the structure shown in FIG. 1D. In some embodiments, the structure shown in FIG. 1D is taken along line I-I in FIG. 3A.

In some embodiments, the magnetic element 109 has multiple sub-layers such as the magnetic layers 108a-108e. In some embodiments, each sub-layers is larger than another sub-layer above it, as shown in FIGS. 1D and 3A. For example, the magnetic layer 108a is larger than the magnetic layer 108b. Similarly, the magnetic layer 108d is larger than the magnetic layer 108e.

Figure 1E:
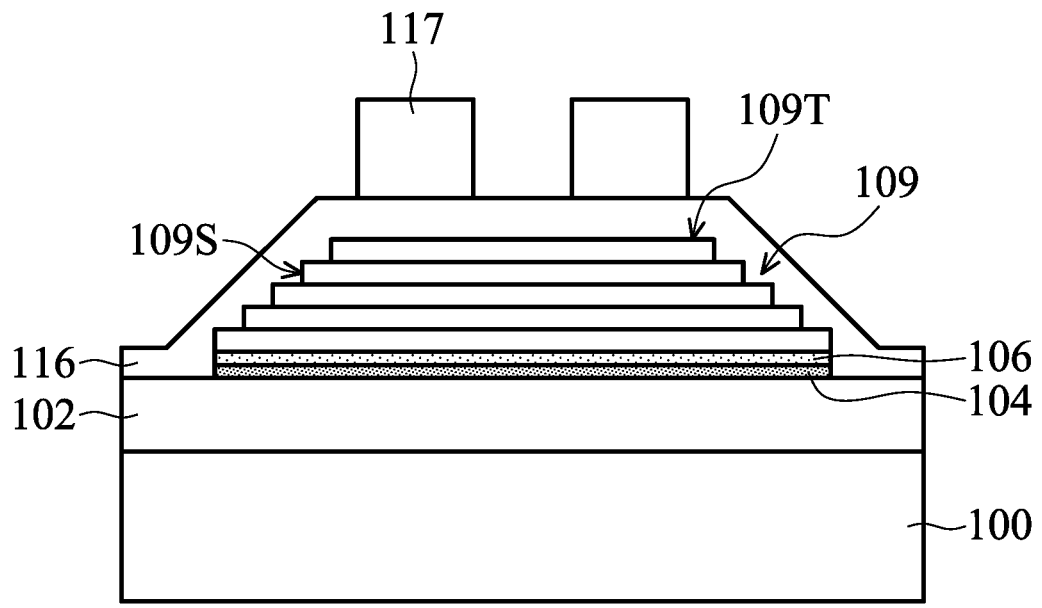

As shown in FIG. 1E, an isolation layer 116 is deposited over the interconnection structure 102 and the magnetic element 109, in accordance with some embodiments. The isolation layer 116 may be made of or include silicon nitride, silicon oxide, silicon oxynitride, one or more other suitable dielectric materials, or a combination thereof. In some other embodiments, the isolation layer 116 is made of or includes a polymer material. For example, the polymer material is polyimide or another suitable material. The isolation layer 116 may be deposited using a CVD process, an ALD process, a spin-on process, a PVD process, one or more other applicable processes, or a combination thereof.

Afterwards, mask elements 117 are formed over the isolation layer 116, as shown in FIG. 1E in accordance with some embodiments. The mask elements 117 are used to assist in a subsequent patterning process of the isolation layer 116. The material and formation method of the mask elements 117 may be the same as or similar to those of the mask element 114.

Figure 1F:
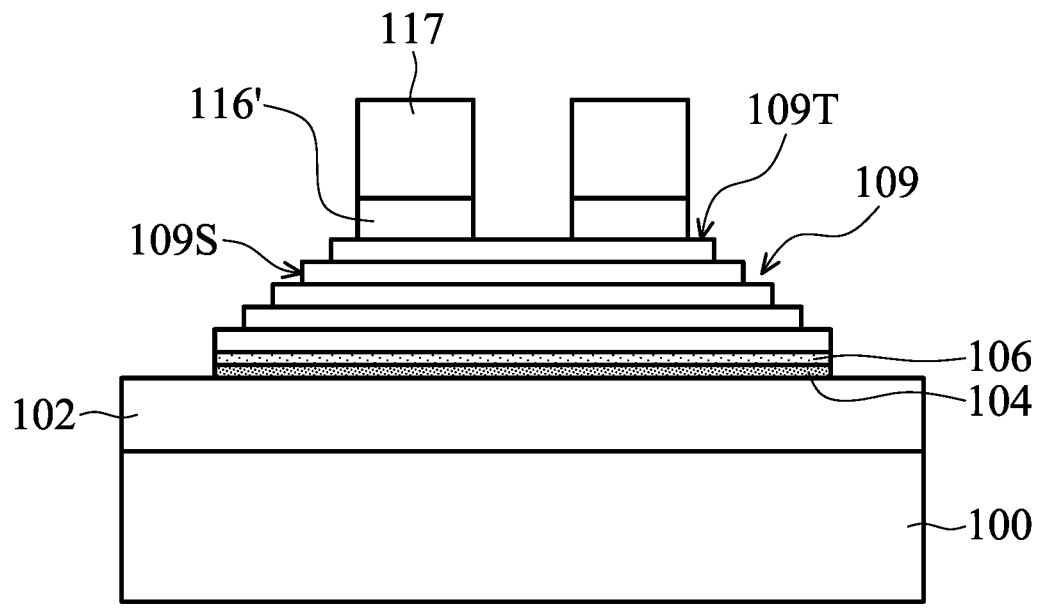

As shown in FIG. 1F, the isolation layer 116 is partially removed, in accordance with some embodiments. The mask elements 117 may be used as an etching mask, and an etching process is used to remove the isolation layer 116 not covered by the mask elements 117. As a result, the remaining portions of the isolation layer 116 form isolation elements 116', as shown in FIG. 1F.

Figure 1G:
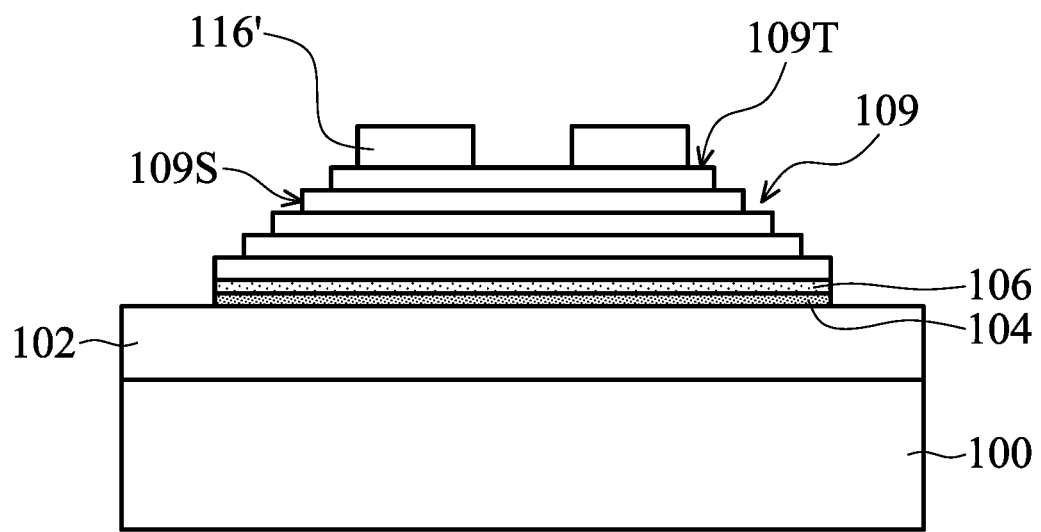
Figure 1H:
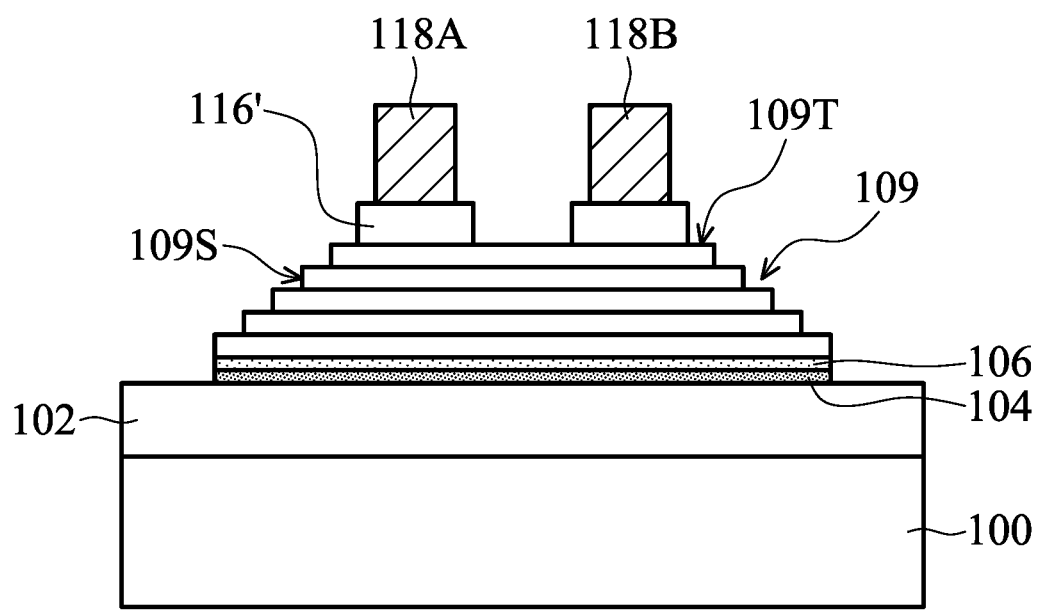
Figure 2A:
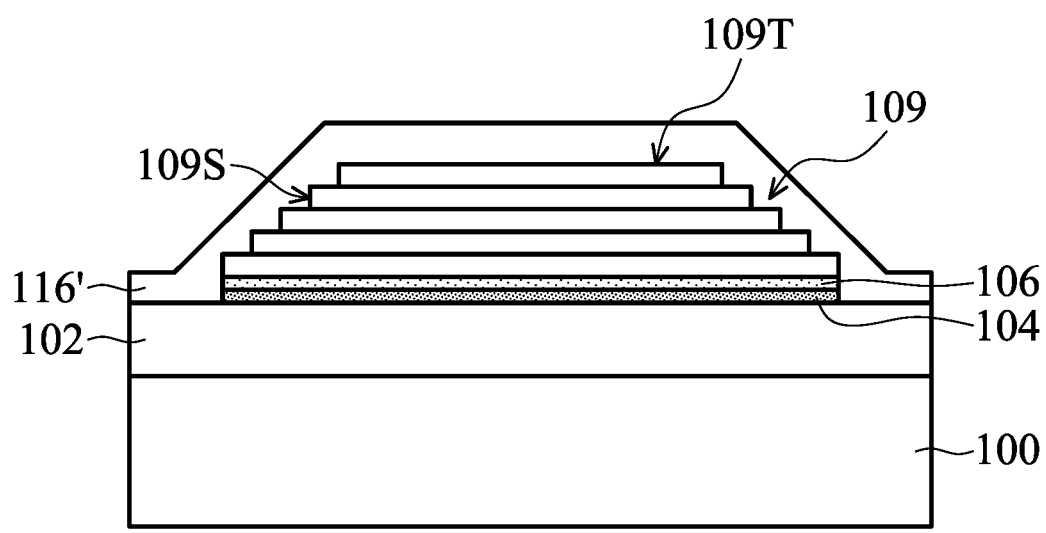
FIGS. 2A-2C are cross-sectional views of various stages of a process for forming a semiconductor device structure, in accordance with some embodiments.
Figure 2B:
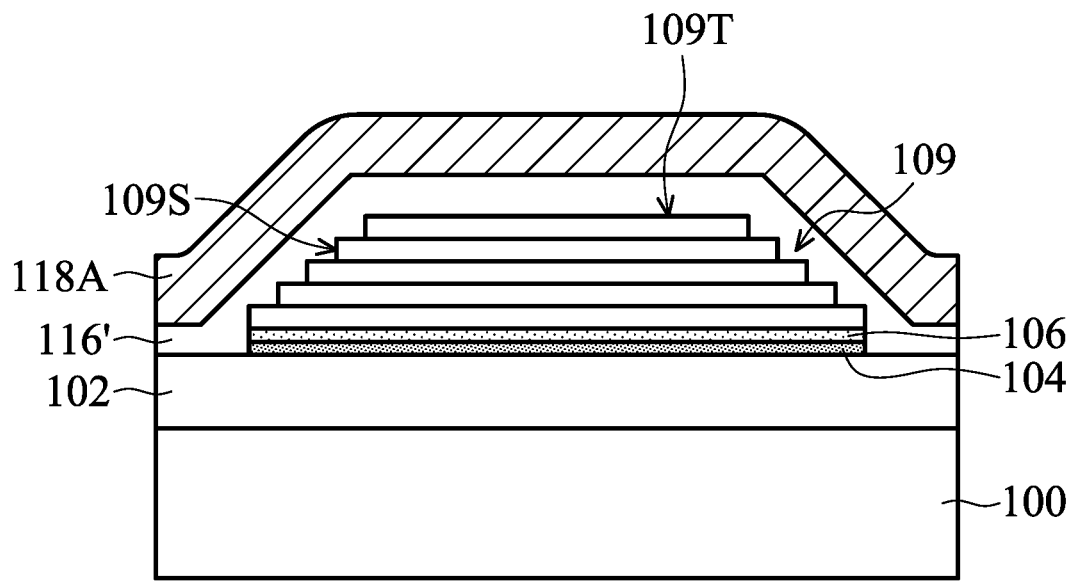
Figure 2C:
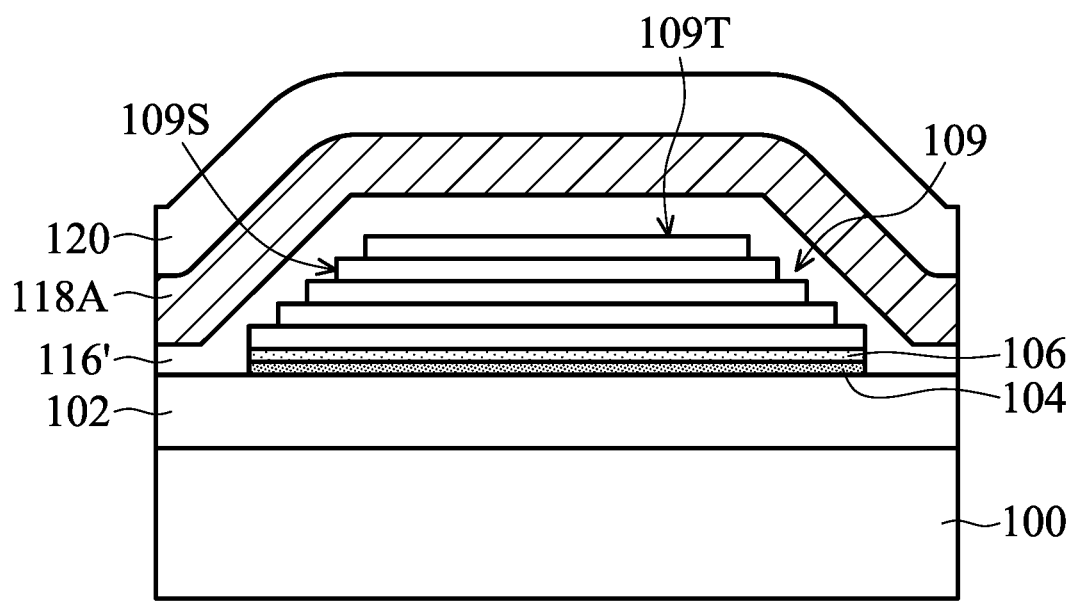

As shown in FIG. 1G, the mask elements 117 are then removed, in accordance with some embodiments. In some embodiments, FIG. 3B is a top view layout view of the structure shown in FIG. 1G. In some embodiments, the structure shown in FIG. 1G is taken along line I-I in FIG. 3B. FIGS. 2A-2C are cross-sectional views of various stages of a process for forming a semiconductor device structure, in accordance with some embodiments. In some embodiments, the structure shown in FIG. 2A is taken along line J-J in FIG. 3B.

In some embodiments, each of the isolation elements 116' extends across the magnetic element 109, as shown in FIGS. 1G, 2A, and 3B. In some embodiments, each of the isolation elements 116' partially covers the top surface 109T of the magnetic element 109. A portion of the top surface 109T is not covered by the isolation elements 116', as shown in FIGS. 1G and 3B. In some embodiments, each of the isolation elements 116' partially covers the sidewall surfaces 109S of the magnetic element 109. A portion of the sidewall surfaces 109S is not covered by the isolation elements 116', as shown in FIGS. 1G and 2A.

As shown in FIGS. 1I1, 2B, and 3C, conductive lines 118A and 118B are formed over the isolation elements 116', in accordance with some embodiments. The isolation elements 116' physically separate the magnetic element 109 from the conductive lines 118A and 118B. In some embodiments, the conductive line 118A extends along an extending direction of the isolation element 116' thereunder. Similarly, the conductive line 118B also extends along an extending direction of the isolation element 116' thereunder.

In some embodiments, the conductive lines 118A and 118B are electrically connected to each other. In some embodiments, the conductive lines 118A and 118B are electrically connected to other conductive lines formed above and below the magnetic element 109. These conductive lines together surround the magnetic element 109. The conductive lines and the magnetic element 109 may together function as an inductor.

The conductive lines 118A and 118B may be made of or include copper, aluminum, gold, cobalt, platinum, one or more other suitable materials, or a combination thereof. In some embodiments, the conductive lines 118A and 118B are formed using an electroplating process. A seed layer is deposited first, and then a mask element is formed over the seed layer. The opening of the mask element defines the positions and profiles of the conductive lines. Then, one or more conductive material is electroplated on the exposed portions of the seed layer. Afterwards, the mask element is removed, and an etching process is used to remove the seed layer originally covered by the mask element. As a result, the conductive lines 118A and 118B are formed.

Many variations and/or modifications can be made to embodiments of the disclosure. In some other embodiments, a metal layer is deposited over the structure shown in FIG. 1G. The metal layer may be deposited using a PVD process, a CVD process, one or more other applicable processes, or a combination thereof. Afterwards, a photolithography process and an etching process are used to pattern the metal layer into the conductive lines 118A and 118B.

Figure 1I:
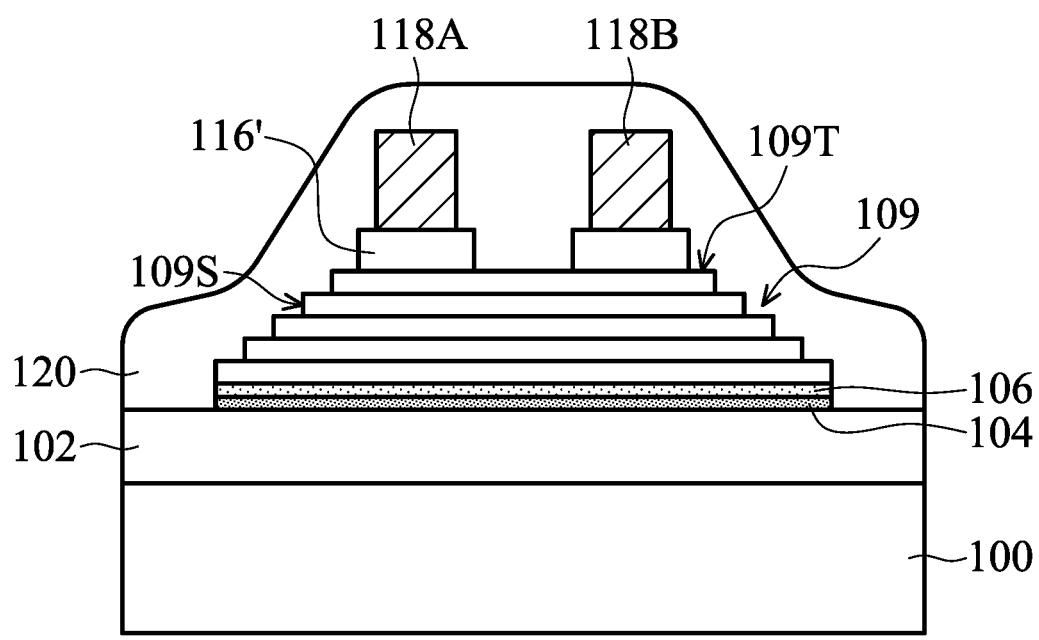

In some embodiments, each of the isolation elements 116' is wider than the conductive line 118A or 118B formed thereon, as shown in FIGS. 1I1 and 3C. Therefore, even if an overlay shift occurs during the formation of the conductive lines 118A and 118B, the isolation elements 116' which are wider than the conductive line 118A or 118B may still separate the magnetic element 109 from the conductive lines 118A and 118B. Therefore, the magnetic element 109 may still work. In some embodiments, a width ratio of the conductive line 118A or 118B to the isolation element 116' is in a range from about 0.5 to about 0.9. In some cases, if the width ratio is smaller than about 0.5, the resistance of the conductive line 118A or 118B may be high. The performance of the magnetic element 109 may be negatively affected. In some other cases, if the width ratio is greater than about 0.9, the risk that the conductive line 118A or 118B is electrically shorted with the magnetic element 109 may be high. Once the conductive line 118A or 118B comes in contact with the magnetic element 109, the magnetic element 109 may not be able to provide desired functions.

As shown in FIG. 3C, a first edge of the conductive line 118A is laterally separated from a first edge of the isolation element 116' by a distance $d_1$. A second edge of the conductive line 118A is laterally separated from a second edge of the isolation element 116' located under the conductive line 118A by a distance $d_2$. In some embodiments, the distances $d_1$ and $d_2$ are the same. In some other embodiments, the distances $d_1$ and $d_2$ are different from each other. The distance $d_1$ or $d_2$ may be in a range from about 2 μm to about 4 μm.

In some embodiments, the conductive line 118A (or 118B) and the isolation element 116' further extend over the interconnect structure 102 that is not covered by the magnetic element 109, as shown in FIGS. 2B and 3C. As shown in FIG. 3C, an end of the conductive line 118A (or 118B) is laterally separated from an edge of the magnetic element 109 by a distance L. In some embodiments, the distance L is in a range from about 4 μm to about 6 μm.

In some cases, if the distance L is smaller than about 4 μm, the performance and quality of the magnetic element 109 may be negatively affected. For example, if an overlay shift occurs during the formation of the conductive line 118A (or 118B), the sidewall surface of the isolation element 109 may not be covered by the conductive line 118A (or 118B). That is, the conductive line 118A (or 118B) may not extend across the magnetic element 109, which may lead to lower efficiency of the magnetic element 109. In some other cases, if the distance L is greater than about 6 μm, stress between the conductive line 118A (or 118B) and a subsequently formed dielectric layer may be increased. There may be a risk that the conductive line 118A (or 118B) would be damaged or broken.

As shown in FIGS. 1I and 2C, a dielectric layer 120 is formed over the conductive lines 118A and 118B, the isolation elements 116', and the magnetic element 109, in accordance with some embodiments. In some embodiments, the dielectric layer 120 is directly deposited over the conductive lines 118A and 118B, the isolation elements 116', and the magnetic element 109. In some embodiments, the dielectric layer 120 is in direct contact with the isolation elements 116', the conductive lines 118A and 118B, and the magnetic element 109.

In some embodiments, the dielectric layer 120 is made of or includes a polymer material. The polymer material may include PBO, epoxy resin, polyimide, one or more other suitable materials, or a combination thereof. The dielectric layer 120 may be formed using a spin-on process, a spray coating process, an injecting process, a molding process, one or more other suitable processes, or a combination thereof. In some embodiments, the formation of the dielectric layer 120 involves a thermal operation. For example, a polymer-containing material is cured at a high temperature to form the dielectric layer 120. Therefore, a high thermal stress may be generated during the formation of the dielectric layer 120. As shown in FIG. 3C, the exposed portions of the isolation elements 116' are minimized, in accordance with some embodiments. The contact area between the isolation elements 116' and the dielectric layer 120 is small. The thermal stress applied on the isolation elements 116' is therefore reduced. The isolation elements 116' and the conductive line 118A (or 118B) thereon are prevented from being damaged or broken by the thermal stress from the dielectric layer 120. The quality and reliability of the semiconductor device structure as illustrated in FIG. 1I are significantly improved.

Afterwards, multiple material layers and device elements may be formed over the dielectric layer 120. Then, a dicing process may be performed to separate the structure into multiple semiconductor dies or die packages that are separate from each other.

Figure 4:
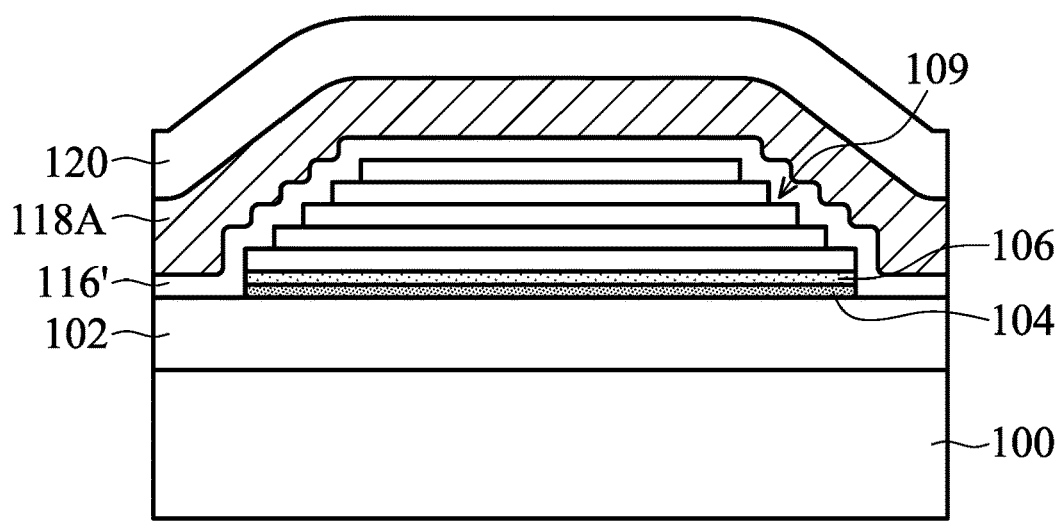
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, the isolation element 116' conformally extends along the sidewall surfaces of the magnetic element 109. In these cases, both the magnetic element 109 and the isolation elements 116' have stair-like profiles, as shown in FIG. 4.

Figure 5:
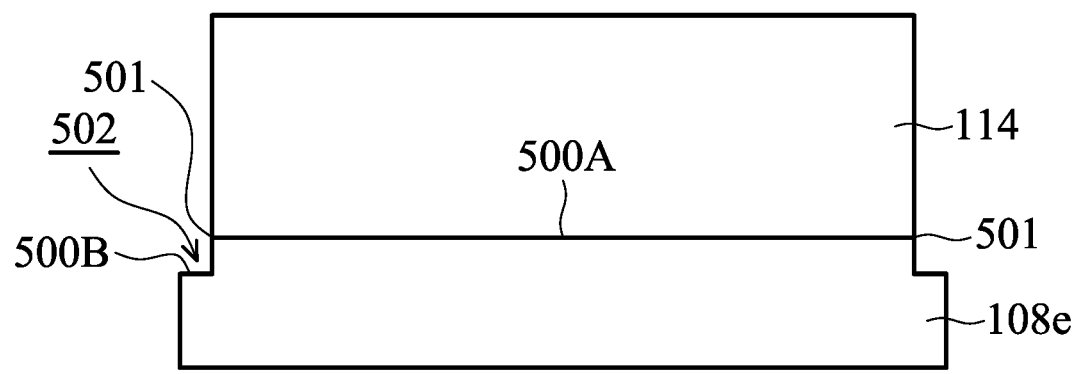
FIG. 5 is a cross-sectional view of a semiconductor device structure, in accordance with some embodiments.

FIG. 5 is a cross-sectional view of a semiconductor device structure, in accordance with some embodiments. In some embodiments, FIG. 5 is an enlarged cross-sectional view of the structure shown in FIG. 1C. In some embodiments, after the etching process for removing the hollow structures 112, portions of the top surface of the topmost magnetic layer 108e are recessed. As shown in FIG. 5, the magnetic layer 108e has a first portion 500A covered by the mask element 114 and a second portion 500B not covered by the mask element 114. After the etching process, the second portion 500B is recessed to a lower height level than the first portion 500A. In some embodiments, a recess 502 is formed. The recess 502 surrounds the first portion 500A.

Figure 6:
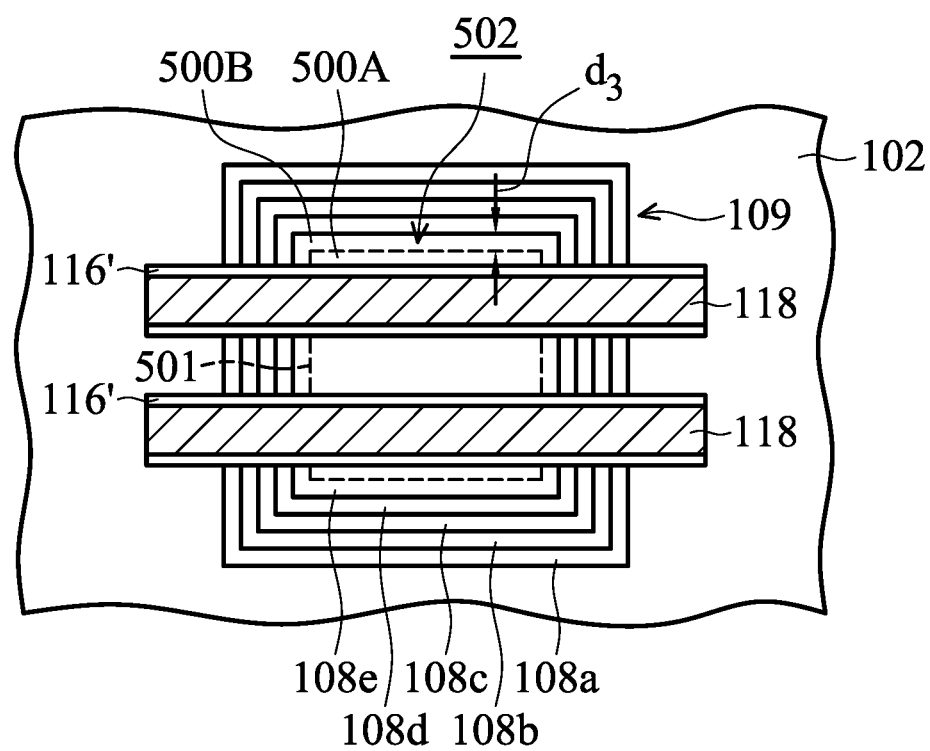
FIG. 6 is a top layout view of a semiconductor device structure, in accordance with some embodiments.

FIG. 6 is a top layout view of a semiconductor device structure, in accordance with some embodiments. In some embodiments, the recess 502 is formed due to the etching process for removing the hollow structures 112. As shown in FIG. 6, the recess has an edge 501 that defines the first portion 500A. As shown in FIG. 6, the recess 501 has a width $d_3$. In some embodiments, the width $d_3$ is in a range from about 5 μm to about 10 μm.

In some cases, if the width $d_3$ is smaller than about 5 μm, the etching process for removing the hollow structures 112 may be negatively affected. Once an overlay shift occurs during the formation of the mask element 114, some of the hollow structures 112 may be covered by the mask element 114. As a result, the hollow structures 112 may not be removed completely, which may result in a performance degradation of the semiconductor device structure.

Embodiments of the disclosure form a protective layer between a magnetic element and a semiconductor substrate. A mask element smaller than the magnetic element is formed to assist in a subsequent etching process of the magnetic element. Due to the protection of the protective layer, a longer operation time of an etching process may be performed to remove voids or hollow structures of the magnetic element. The quality of the magnetic element is therefore improved. A patterned isolation element and a conductive line thereon are formed to extend across and partially cover the magnetic element. A dielectric layer is then formed over the magnetic element, the patterned isolation element, and the conductive line. Because the patterned isolation element has a limited contact area to the dielectric layer, the stress between the dielectric layer and the patterned isolation element is reduced. The patterned isolation element and the conductive line are prevented from being damaged. The quality and reliability of the semiconductor device structure are significantly improved.

In accordance with some embodiments, a method for forming a semiconductor device structure is provided. The method includes forming an etch stop layer over a semiconductor substrate and forming a magnetic element over the etch stop layer. The method also includes forming an isolation element extending across the magnetic element. The isolation element partially covers the top surface of the magnetic element and partially covers sidewall surfaces of the magnetic element. The method further includes forming a conductive line over the isolation element. In addition, the method includes forming a dielectric layer over the conductive line, the isolation element, and the magnetic element.

In accordance with some embodiments, a method for forming a semiconductor device structure is provided. The method includes forming a protective layer and an etch stop layer over a semiconductor substrate. The method also includes forming a magnetic element over the etch stop layer and forming a mask element to partially cover a top surface of the magnetic element. The method further includes performing an etching process to remove voids from sidewall surfaces of the magnetic element. In addition, the method includes forming an isolation element over the magnetic element and forming a conductive line over the isolation element. The method includes forming a dielectric layer over the conductive line, the isolation element, and the magnetic element.

In accordance with some embodiments, a semiconductor device structure is provided. The semiconductor device structure includes a semiconductor substrate and a magnetic element over the semiconductor substrate. The semiconductor device structure also includes an isolation element extending across the magnetic element. The isolation element partially covers a top surface of the magnetic element and partially covers sidewall surfaces of the magnetic element. The semiconductor device structure further includes a conductive line over the isolation element. In addition, the semiconductor device structure includes a dielectric layer over the conductive line, the isolation element, and the magnetic element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a magnetic element over the substrate;
an isolation element over the magnetic element, wherein the magnetic element is wider than the isolation element;
a conductive line over the isolation element;
a second isolation element extending across the magnetic element, wherein the second isolation element partially covers the top surface of the magnetic element and partially covers sidewall surfaces of the magnetic element; and
a second conductive line over the second isolation element.

2. The semiconductor device structure as claimed in claim 1, wherein opposite edges of the conductive line are laterally between opposite edges of the isolation element.

3. The semiconductor device structure as claimed in claim 1, wherein the isolation element extends along sidewalls of the magnetic element.

4. The semiconductor device structure as claimed in claim 1, wherein the magnetic element comprises multiple sub-layers, and each sub-layer is wider than another sub-layer above it.

5. The semiconductor device structure as claimed in claim 4, wherein a topmost sub-layer of the sub-layers has a first portion and a second portion, the second portion surrounds the first portion, and the first portion is thicker than the second portion.

6. The semiconductor device structure as claimed in claim 5, wherein the conductive line extends across the first portion and the second portion.

7. The semiconductor device structure as claimed in claim 1, further comprising a dielectric layer over the magnetic element and the conductive line.

8. The semiconductor device structure as claimed in claim 7, wherein the dielectric layer is in direct contact with the isolation element, the conductive line, and the magnetic element.

9. The semiconductor device structure as claimed in claim 1, wherein the isolation element is in direct contact with the conductive line.

10. The semiconductor device structure as claimed in claim 1, wherein the conductive line is wider than the magnetic element.

11. A semiconductor device structure, comprising:
a substrate;
a magnetic element over the substrate, wherein the magnetic element comprises multiple sub-layers, and each sub-layer is wider than another sub-layer above it;
a conductive feature extending across the magnetic element and partially covering the magnetic element; and
an isolation element between the conductive feature and the magnetic element, wherein opposite edges of the isolation elements are laterally between opposite edges of the magnetic element.

12. The semiconductor device structure as claimed in claim 11, wherein opposite edges of the conductive features are laterally between the opposite edges of the isolation element.

13. The semiconductor device structure as claimed in claim 11, wherein a topmost sub-layer of the sub-layers has a first portion and a second portion, the second portion surrounds the first portion, and the first portion is thicker than the second portion.

14. The semiconductor device structure as claimed in claim 13, wherein the conductive feature extends across the first portion and the second portion.

15. The semiconductor device structure as claimed in claim 13, wherein the second portion has a width in a range from about 5 μm to about 10 μm.

16. A semiconductor device structure, comprising:
a substrate;
a magnetic element over the substrate;
an isolation element over the magnetic element;
a conductive line over the isolation element, wherein the conductive line extends across opposite edges of the magnetic element; and
a dielectric layer over the conductive line, the isolation element, and the magnetic element, wherein the dielectric layer is closer to the magnetic element than the conductive line.

17. The semiconductor device structure as claimed in claim 16, wherein the dielectric layer is in direct contact with the isolation element and the magnetic element.

18. The semiconductor device structure as claimed in claim 16, further comprising an etch stop layer between the substrate and the magnetic element, wherein the etch stop layer comprises tantalum oxide, zirconium oxide, tantalum nitride, or a combination thereof.

19. The semiconductor device structure as claimed in claim 16, wherein the isolation element is wider than the conductive line and narrower than the magnetic element.

20. The semiconductor device structure as claimed in claim 16, wherein the dielectric layer covers sidewalls of the magnetic element, the isolation element, and the conductive line.

\* \* \* \* \*